(12) United States Patent
Land

(10) Patent No.: US 6,516,086 B2
(45) Date of Patent: Feb. 4, 2003

(54) METHOD AND APPARATUS FOR DISTINGUISHING REGIONS WHERE A MATERIAL IS PRESENT ON A SURFACE

(75) Inventor: Egbert F. A. Land, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/338,054

(22) Filed: Jun. 22, 1999

(65) Prior Publication Data

US 2002/0176618 A1 Nov. 28, 2002

(30) Foreign Application Priority Data

Jul. 13, 1998 (EP) .............................. 98202355

(51) Int. Cl.⁷ ................................ G06K 9/00
(52) U.S. Cl. ...................... 382/147; 382/149; 382/150
(58) Field of Search ................... 382/141, 143, 382/145, 146, 147, 148, 149, 150, 151; 348/86, 87, 125, 126; 356/237.1–237.6, 606; 716/15, 16

(56) References Cited

U.S. PATENT DOCUMENTS

| | | | |
|---|---|---|---|
| 4,650,333 A | * | 3/1987 | Crabb et al. ................. 356/606 |
| 4,908,871 A | * | 3/1990 | Hara et al. .................. 382/147 |
| 5,305,392 A | * | 4/1994 | Longest, Jr. et al. ........ 382/112 |
| 5,377,002 A | * | 12/1994 | Malin et al. ............. 356/237.2 |
| 5,621,811 A | * | 4/1997 | Roder et al. ................ 382/147 |

FOREIGN PATENT DOCUMENTS

| | | | | |
|---|---|---|---|---|
| WO | 9802756 | * | 1/1998 | ........... G01R/31/28 |

* cited by examiner

Primary Examiner—Joseph Mancuso
Assistant Examiner—Vikkram Bali
(74) Attorney, Agent, or Firm—Aaron Waxler

(57) ABSTRACT

A property of the surface such as height is sensed as a function of position on the surface. A statistical spread in the sensed property as a function of the position is computed. Regions where the material is present are distinguished from other regions on the basis of the spread, e.g. conductor tracks on a PCB assembly are distinguished from a PCB substrate by having lower spread.

8 Claims, 2 Drawing Sheets

METHOD AND APPARATUS FOR DISTINGUISHING REGIONS WHERE A MATERIAL IS PRESENT ON A SURFACE

BACKGROUND OF THE INVENTION

The invention relates to a method and apparatus for distinguishing regions where a material is present on a surface from other regions, as set forth in the preamble of claims 1 and 5.

Such a method and apparatus are known from PCT patent application no WO 98/2756.

This document concerns the inspection of a printed circuit board (PCB) assembly. A PCB assembly contains a substrate and conductor tracks on the substrate. During manufacture solder paste is applied to the conductor tracks and leads of components are soldered onto the conductor tracks.

The manufacturing process of the PCB assembly is supported by measurements, for purposes such as alignment and inspection. PCT patent publication WO 98/2756 describes optical measurement of the height of the PCB assembly as a function of position of xy-position on the substrate surface. The height at positions where there are conductor tracks is greater than at positions where there is only substrate. The height is used to distinguish the positions where conductor tracks are present on the surface from other positions. Similarly the position of components and of solder paste can be determined. This can be used for example for inspection, for measuring the position of conductor tracks more accurately (e.g. for component placement) and/or for computing the area or volume of solder paste or conductor tracks. Instead of height measurement other properties of the PCB assembly may be measured, for example light reflection or absorption etc.

It has been found that the measurement of height and of other properties suffers from noise. There is a spread in the measured height values which sometimes makes it difficult to distinguish regions with the height level of conductor tracks from regions with the height level of the substrate. Similarly it may be difficult to detect components or solder paste. In general the noise reduces the reliability with which the height level may be used to distinguish regions with different materials on the substrate surface.

It is an object of the invention to increase the reliability with which a region where a material is present on a surface may be distinguished.

It is a further object of the invention to increase the accuracy with which the location of a region where a material is present on a surface may be determined.

SUMMARY OF THE INVENTION

The method and apparatus according to the invention are characterized as set. The invention is based on the realization that the nature of the statistical spread of a sensed properties of the surface such as the height is different for different materials on the surface. Hence, a measure of the spread in the measurement of such a property may be computed and used to distinguish regions where a certain material is present. Such a measure of spread could be for example the variance (mean square deviation) of the height, the standard deviation or some measure of correlation between the heights at different positions.

In a PCB assembly for example there is less mean square deviation in the measured height of the conductor tracks than in the measured height of the substrate where there are no conductor tracks. When the conductor tracks are covered by solder paste the means square deviation is even lower.

Therefore in an embodiment of the invention the method and apparatus are used for distinguishing regions on a PCB assembly where conductor tracks are respectively present or absent by distinguishing regions where the spread is relatively smaller or larger respectively. Preferably the sensed property is representative of height of material above the surface. The method of sensing this property may for example be optical e.g. sensing the position of intersection between a scanning light source and the surface or the material on the surface.

In an embodiment of the method and apparatus according to the invention the spread is determined in each of a series of windows of positions on the surface.

DETAILED DESCRIPTION OF THE PREFERRED EMBODIMENTS

Figure 1:
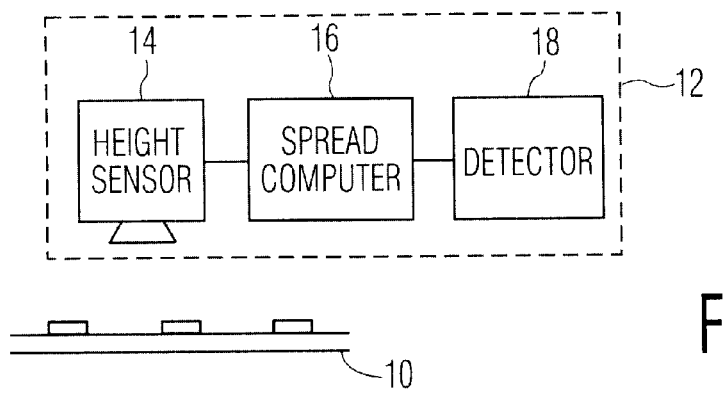
FIG. 1 shows a setup for measuring a property of a surface

FIG. 1 shows a setup for measuring a property of a surface. The setup contains a PCB assembly 10 and a measuring apparatus 12. The measuring apparatus 12 contains a cascade of a height sensing section 14, a spread computation section 16 and a detector section 18. The height sensing section 14 contains for example an optical height sensor, which scans the surface of the PCB assembly 10 along successive lines of points on the surface. The measuring apparatus 12 may be implemented partly as a suitably programmed general purpose computer. Alternatively any combination of specially designed hardware may be used, or a number of parallel computers, each for processing measurements of a respective different area on the surface of the PCB assembly respectively.

The setup of FIG. 1 may be used for various purposes. For example, in case of a PCB for which design data is available, this design data may be used to produce an initial prediction of positions where material such as conductor tracks, solder paste, solder resist etc. are present on the PCB and the setup can be used to determine more accurate positions or to inspect whether material is present at all and/or in the right quantity, or whether material is present in the wrong places.

In operation, the height sensing section 14 measures a signal representative of the height h of the PCB assembly 10 as a function of xy position transverse to the direction in which the height is measured. Various techniques for height measurement are known per se. For example optical techniques are available with an xy resolution of approximately 50×50 micrometer and a height resolution of 10 micrometer. Although height measurement is a preferred embodiment, the invention is not limited to height measurement, but may be applied as well to measurements of other properties, such as light absorption and/or reflection from the PCB assembly.

Figure 2:
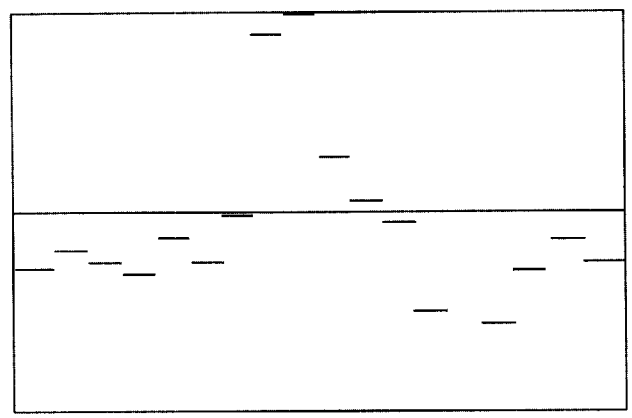
FIG. 2 shows a first result of measuring a property of a surface as a function of position

FIG. 2 shows a typical result of an optical height (h) measurement as a function of position (x) along a line on the surface of the PCB assembly 10. The result contains three one-dimensional regions A, B, C which correspond to a bare substrate surface, a conductor track and again bare substrate surface of the PCB assembly 10 respectively. Conductor tracks may be very narrow, e.g. as narrow as 67 micrometer, that is barely larger than the measurement resolution. At the borders between the areas there are spikes in the measurement which are due to optical artifacts corresponding to reflection off the sides of the conductor tracks.

The height measurements will be used for example for determining the position of the conductor tracks or their width. The position is not exactly known due to such effects as deformation of the PCB assembly surface and misalignment of the PCB assembly. The width also may deviate from the designed width.

On average the height in the conductor track region B is higher than in the other regions A, C, but especially the bare substrate regions contain a lot of noise in the height measurement. As a result it is not possible to determine with certainty from a single height measurement whether this measurement corresponds to a region B with a conductor track or to a region A, C with bare substrate.

It should be noted that the spread in the height measurements is greater in the regions A, C of bare substrate than in the region B of conductor track (even when the conductor track is covered with solder resist, when the solder resist is mostly transparent). This is a result the greater roughness of the surface in comparison with the conductor tracks. Often, the height measurement measures the height fibers in the substrate, the resin between the fibers being more or less transparent. Similarly, it has been found that often the measured height of conductor tracks covered with solder paste exhibits less spread than conductor tracks without solder paste. When the surface of the substrate is covered with solder paste, its measured height exhibits more spread than uncovered conductor tracks.

According to the invention the difference in spread of the measurements between regions with different materials on the surface of the PCB assembly is used to distinguish between such regions.

Figure 3:
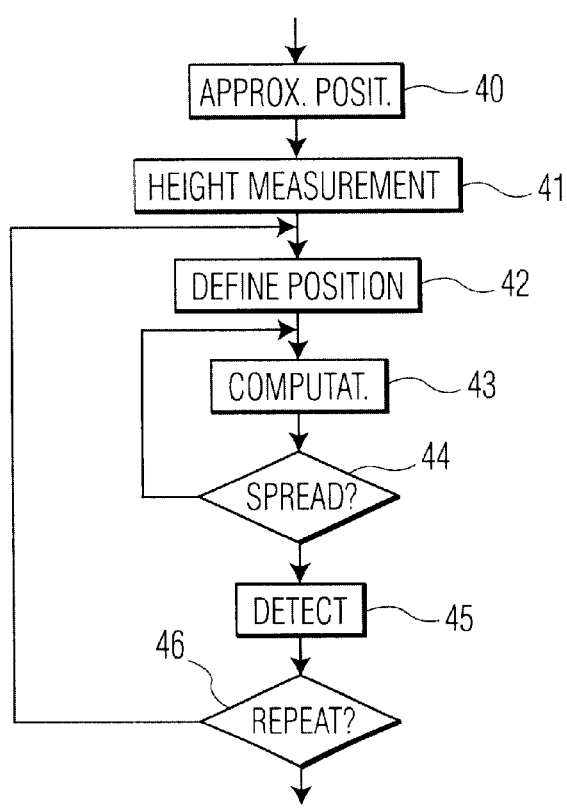
FIG. 3 shows a flow-chart of a method for detecting material

FIG. 3 shows a flow-chart of a method for detecting the presence of conductor tracks using the spread of the measurements of the height on a PCB assembly. This flow chart may be executed by the apparatus 12.

In a first step 40 of the flow-chart an approximate position of the PCB assembly as a whole is determined, for example using fiducial markings. Also in the first step 40 a number of areas on the PCB assembly is selected where the position of material should be measured. This selection may be based on a prior selection performed on the basis of design data for a whole group of PCB's. Such a prior selection may be performed off-line, i.e. before the PCB's are actually available.

In a second step 41 of the flow-chart the height h of the PCB assembly is measured at a number of different xy positions in the areas on the PCB assembly. This may be performed using a scan, where the height is measured along successive scan lines e.g. 18 micron apart from one another, indiscriminately of whether the heights are actually to be used for inspection or not.

In a third step 42 of the flow-chart data concerning the PCB assembly is used that describes a position where the measured height h of that PCB should be processed. This data defines an elongated window of say 20 to 40 position units long (one unit is for example 50 micrometer) and 1 position unit wide, with its long axis in parallel to the expected direction of the conductor track. The data also defines a series of positions where this window should be placed in the area, generally along a straight line.

Figure 4:
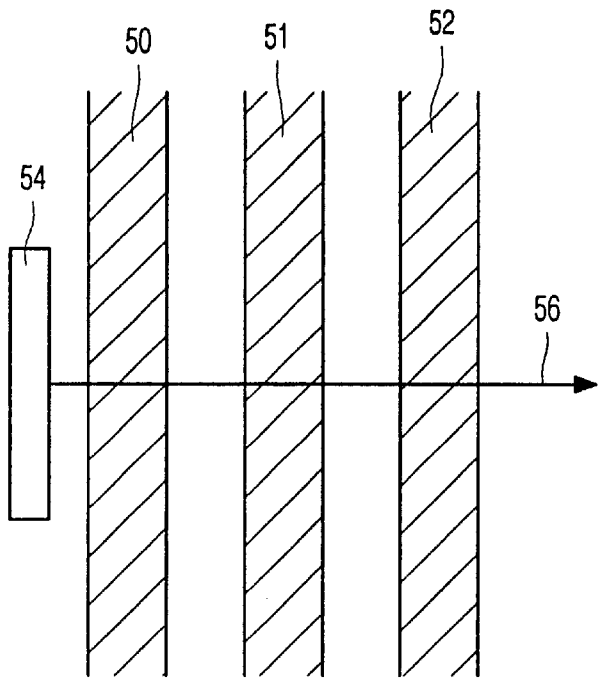
FIG. 4 shows a window positioned relative to conductor tracks on a PCB

FIG. 4 shows a number of conductor tracks 50, 51, 52 and such an elongated window 54. A direction of movement 56 is shown for moving the window 54 in a direction 56 transverse to its long axis.

In a fourth step 43 of the flow-chart the spread in the height measurements in the window 54 at a first position along the direction of movement is computed. For this purpose, the measured height at a number of positions is used. Conceptually, the window 54 is placed at the first position along the direction of movement 56. The measured height values for positions that lie inside the windows are collected and the spread in these values is determined, for example by computing the mean square deviation from the average measured height value, or from the difference between the highest and lowest measured height (or nth highest and mth lowest measured height where m, n are e.g. 2 and are rank numbers of the measured values in order of height).

The computation of the spread of the height measurements in the window 54 is repeated for a number of positions of the window along the direction of movement 56. In a fifth step 44 of the flow-chart it is checked whether the spread has been determined for windows at all positions. If not the fourth step is repeated for a different position.

Figure 5:
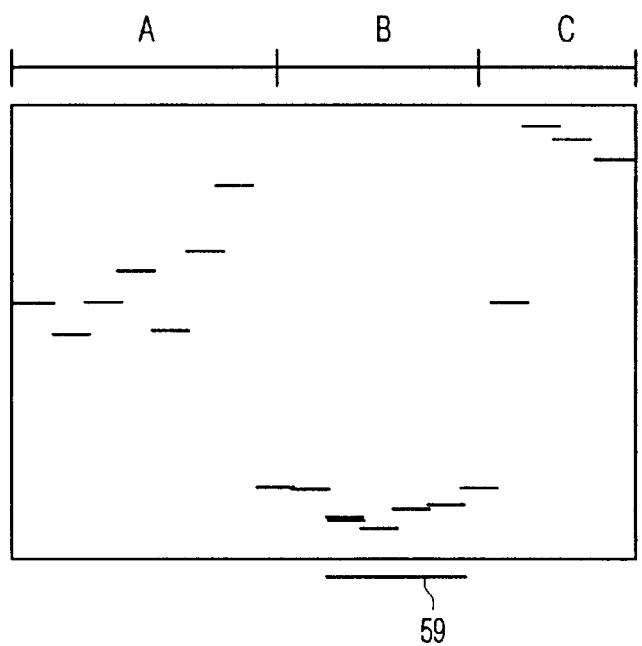
FIG. 5 shows a computed spread as a function of window position.

FIG. 5 shows the spreads computed for a number of windows 54 at successive positions along the direction of movement 56 respectively. In FIG. 4 regions A, B, C of substrate, conductor track and substrate respectively corresponding to the regions of FIG. 2 have been indicated. It will be noted that the computed spread values in the region B of conductor track is significantly lower than the spread in the regions A, C of substrate.

In a sixth step 45 of the flow chart the spread in the measured heights computed for different positions of the window 56 are used by way of example to detect positions of conductor tracks. This may be done in various ways, for example by detecting conductor track everywhere where the spread is below a threshold value (the threshold value may be set in advance or computed from a histogram of computed spread values in the way one conventionally selects grey value thresholds from histograms).

Alternatively, one may detect a conductor track at a position where the sum of the spreads in "n" windows 54 at successive positions along the direction 56 is smaller (or not bigger) than a similar sum at any other position (n corresponds for example to slightly less than the expected conductor track width). More complicated measures of spread may also be used, such as correlations between deviations from the average height at different positions on the PCB assembly, or selected spectral components of the spectral density of the spread (i.e. the fourier transform of the correlation as a function of position) etc and combinations thereof.

In FIG. 5 such a region where a conductor track has been detected has been indicated by a bar 59.

The whole process of computation of spread for windows 54 at different positions and detection of the position of conductor tracks may be repeated for different conductor tracks. In a seventh step 46 it is tested whether these steps should be repeated. If so the flow chart returns to the third step 42. Otherwise the flow-chart exits.

Of course the method according to the invention is not limited to the precise steps of the flow-chart shown in FIG. 3. For example, the measurement of the height and computation of the spread need not be separated in different steps, but may be executed apace, different areas being inspected as measured heights for those areas become available during scanning of the PCB assembly.

Also, the third to sixth steps may be performed in parallel by a similarly programmed processors, each having one or more different regions assigned to it for determining the spread of that region etc. In this case the measured heights are supplied to all of these processor in parallel and each processor selects those heights that are needed for the regions assigned to it.

Subsequent to the detection of a region of conductor track, a height of the PCB assembly in the detected region may be determined. This may be achieved for example by computing averages of the measured height values in the respective windows 54, interpolating the averages in the detected region and selecting the interpolated average height value at the point of minimum slope of the average height values as a function of position.

The distinction in spread between different regions substrate regions may be used to inspect the PCB assembly, instead of, or in addition to its use in height determination. In case there is one checks whether the spread in the measured height values in regions between the conductor tracks 50 and 51 or 51 and 52 is lower than the normal spread occurring in regions of uncovered PCB assembly substrate. If the spread in these regions is too low, this is used as an indication that these conductor tracks are bridged by a conductor or by solder paste, which indicates an error in the PCB assembly.

Furthermore, the distinction in spread between different regions may be used to measure the position of fiducial marks used for measuring the position of the PCB assembly relative to the height sensing section.

In certain cases, for example when batches of PCB with different properties are used, the relation between the statistical spread of the measured height of e.g. substrate, conductor tracks and solder paste may vary from PCB to PCB or from batch to batch. E.g. the spread in height of solder paste may be less than that of conductor in some batches.

In these cases, a "teaching" step is preferably included in the method, in which statistical properties of a PCB or a batch are determined a number of times for regions covered with known material (e.g. within large areas of substrate, conductor or solder paste). The determination of these statistical properties is then used to define a range of values of these statistical properties for each material. During inspection of the PCB positions on the PCB which have a measure of statistical spread in a particular range be classified as being covered by the corresponding material.

An inspection device for detecting material on a surface is preferably equipped with a general purpose "noise-ruler", that is, a function that may be called with at least a position and direction argument, defining an xy position on a surface to be inspected and a direction along which this surface should be inspected. In response to such a call the "noise-ruler" determines the spread in a measured property of the surface in each of a number of windows which are elongated transverse to the direction, the positions lying along said direction. The noise-ruler returns the spread as a function of position or fist a function to the spread as a function of position and returns information about the fitted function.

What is claimed is:

1. A method of distinguishing regions where a material is present on a surface, the method comprising the steps of
   sensing a property of the surface as a function of position on the surface;
   distinguishing the position or width of regions on the basis of said sensed property,
   characterized by the steps of
      computing a measure of statistical spread in said sensed property as a function of the position;
      distinguishing regions where said material is present from other regions on the basis of said measure of statistical spread.

2. A method according to claim 1, wherein said surface is the surface of a substrate of a printed circuit board assembly, the method distinguishing a region containing a conductor track on the substrate from a region without conductor track where the measure of statistical spread indicates a relatively smaller spread and a relatively larger spread respectively.

3. A method according to claim 1, wherein said sensed property is a property representative of height of material in a direction transverse to the surface.

4. A method according to claim 1, wherein an aggregate measure of statistical spread is computed over each respective window of positions from a series of windows of positions on the surface, the regions being distinguished by detecting one or more of the windows that have a relatively lower value of the spread than other windows.

5. An apparatus containing a detector for distinguishing regions where a material is present on a surface, the detector comprising
   a sensor for sensing a property of the surface as a function of position on the surface;
   a discriminator for discriminating regions where said material is present from other regions on the basis of said sensed property, characterized in that the discriminator is arranged for computing a measure of statistical spread in said sensed property as a function of the position and for discriminating the position or width of regions on the basis of said measure of statistical spread.

6. An apparatus according to claim 5, wherein said surface is the surface of a substrate of a printed circuit board assembly, the discriminator distinguishing a region containing a conductor track on the substrate from a region without conductor track where the measure of statistical spread indicates a relatively smaller spread and a relatively larger spread respectively.

7. An apparatus according to claim 5, wherein said sensor is a height sensor for sensing a property representative of a height of material in a direction transverse to the surface.

8. An apparatus according to claim 5, wherein the discriminator is arranged for computing an aggregate of the measure of statistical spread for each respective window of positions from a series of windows on the surface, the regions being distinguished by detecting one or more of the windows that have a relatively lower value of the spread than the other windows.

* * * * *